(12) United States Patent
Okawa

(10) Patent No.: US 7,403,031 B2
(45) Date of Patent: Jul. 22, 2008

(54) MEASUREMENT APPARATUS FOR FET CHARACTERISTICS

(75) Inventor: Yasushi Okawa, Tokyo (JP)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/789,833

(22) Filed: Apr. 26, 2007

(65) Prior Publication Data

US 2007/0279081 A1 Dec. 6, 2007

(30) Foreign Application Priority Data

Jun. 6, 2006 (JP) ............................. 2006-157771

(51) Int. Cl.
*G01R 31/26* (2006.01)
(52) U.S. Cl. ...................... 324/769; 324/765; 324/73.1
(58) Field of Classification Search ....................... None
See application file for complete search history.

(56) References Cited

U.S. PATENT DOCUMENTS

| | | | |
|---|---|---|---|
| 5,905,384 A | 5/1999 | Inoue et al. .................. | 324/769 |
| 6,998,869 B2 * | 2/2006 | Tanida et al. ................. | 324/765 |
| 2006/0145708 A1 | 7/2006 | Saito ........................... | 324/713 |
| 2006/0273807 A1 | 12/2006 | Okawa ......................... | 324/713 |
| 2007/0013407 A1 | 1/2007 | Okawa ......................... | 324/769 |

OTHER PUBLICATIONS

Jenkins, K.A. et al. "Measurement of I-V Curves of Silicon-on-Insulator (SOI) MOSFET's Without Self-Heating". IEEE Electron Device Letters, vol. 16, No. 4, Apr. 1995.
International Conference on Microelectronic Test Structures Tutorial Short Course. Mar. 6, 2006.

* cited by examiner

*Primary Examiner*—Minh N Tang
(74) *Attorney, Agent, or Firm*—Marc Bobys

(57) ABSTRACT

A measurement apparatus for FET characteristics comprises a divider connected to a pulse generator for dividing pulses from the pulse generator into first and second pulses; a first SMU; a first switch for selecting pulses from the divider or voltage from the first SMU; a terminal resistor for applying signals from the first switch and supplying the signals to the first terminal of the device under test; a second and a third SMU; a bias-T connected to the third SMU; a second switch for selecting to connect the second terminal of the device under test to the second SMU or to connect the second terminal to signals of the bias-T obtained by multiplexing the voltage from the third SMU; and voltage measurement unit connected to the divider and the bias-T.

6 Claims, 6 Drawing Sheets

MEASUREMENT APPARATUS FOR FET CHARACTERISTICS

BACKGROUND

1. Technical Field

The present disclosure relates to technology for the measurement of characteristics whereby voltage is applied to the gate of an FET and the drain current that flows to the FET as a result is measured, and in particular, to a measurement apparatus for FET characteristics having both a function for DC (direct current) measurement whereby DC signals are applied to a gate and a function for AC (alternating current) measurement whereby AC signals are applied to a gate.

2. Prior Art

Microstructuring of the IC (semiconductor integrated circuit) has led to new means being introduced to technology for the assessment of FET characteristics. When measuring the IV characteristic (voltage-current characteristic) of an advanced MOSFET that uses SOI (Silicon-On-Insulator), strained silicon, high-k (high permittivity) materials, and the like, the heat generated by the FET itself makes it impossible to obtain very precise IV characteristic measurement results by conventional measurement methods in which DC voltage is applied to a gate. Therefore, a measurement method is known whereby measurement results that are not affected by the generation of heat are obtained by applying pulses with a short time width to the gate, as in IEEE Electron Device Letters, Vol. 16, No. 4, April 1995, K. A. Jenkins and J. Y-C. Sun, pp. 145-147.

Moreover, a measurement apparatus that operates by the above-mentioned new measurement method (referred to as pulse IV measurement hereafter) is cited on page 16 of IEEE ICMTS (International Conference on Microelectronic Test Structure) Textbook of Tutorial Short Course, Session 4: Characterizing Transient Device Behavior Using Pulse I-V Technique, Mar. 6, 2006, Y. Zhao, and it is reported that this apparatus is capable of DC measurement without changing the connection. FIG. 4 of the present Specification shows the measurement apparatus on the page 16 of the cited text book as conventional measurement system 700 for FET characteristics.

The hypothetical operation of conventional measurement apparatus 700 for FET characteristics will be described while referring to FIG. 4. The output of a pulse generator (PG) 706 is connected to the gate terminal of an FET 712 of a device under test (DUT); a DC measuring unit 702 is further connected between these via a bias-T 710; and an oscilloscope 704 is further connected between these via a pick-off T 708.

Oscilloscope 704 is connected to the drain terminal of DUT 712 via a bias-T 714, and DC measuring device 702 is further connected to the drain terminal via a bias-T 714. DC measuring device 702 also functions as a controller and controls oscilloscope 704 and pulse generator 706. The specific structure of pick-off T 708 is not described in detail in the aforementioned text book and therefore will be treated as a type of black box means for transmission of signals to the oscilloscope in the present Specification.

It is estimated that when characteristics are measured by applying a pulse to the gate terminal of DUT 712, a pulse waveform is output from pulse generator 706 as applied voltage Vg, this pulse is monitored by oscilloscope 704, a bias voltage from DC measuring unit 702 is applied to the drain terminal of DUT 712 via bias-T 714, and fluctuations in voltage Vd that are manifested at drain terminal of DUT 712 as a result of this pulse are monitored by oscilloscope 704 via bias-T 714. It is estimated that in case that a predetermined baseline voltage of the pulse is required for the pulse to the base terminal of DUT 712, a bias voltage is added from DC measuring unit 702 via bias-T 710, because the DC component of the output from pulse generator 706 is blocked by the capacitor of bias-T 710, as will be discussed later.

When DC measurement is performed, DC voltage is applied from DC measuring unit 702 to the base terminal of DUT 712 via bias-T 710 and the voltage at the drain terminal of DUT 712 is measured by DC measuring unit 702 via bias-T 714.

The bias-T will now be described while referring to FIG. 5. FIG. 5 shows the structure of a typical bias-T 800. A DC port 802 and an AC+DC port 806 are connected via an inductor, and an AC port 804 and an AC+DC port 806 are connected via a capacitor, in essence, a condenser. Consequently, based on the purpose for which it is operated, it is estimated that DC measuring device 702 is connected to the DC port of bias-T 710 in FIG. 4, and pulse generator 706 is connected to the AC port, while DC measuring unit 702 is connected to the DC port of bias-T 714 and oscilloscope 704 is connected to the AC port.

The following problems are encountered with the use of the above-mentioned measurement apparatus 700 for FET characteristics.

First, a long delay becomes necessary when switching from pulse IV measurement to DC measurement. The reason for this is that the capacitors housed inside the two bias-Ts are used for preventing leakage of direct current signals to the AC ports, and a capacitor with a relatively large value of several µF is usually used. Therefore, transient current for charging the capacity of the capacitor of bias-T 710 flows for a relatively long time beginning immediately after the DC voltage has been applied from DC measuring device 702 to the gate terminal. Consequently, it must not be measured during this period in order to obtain an accurate measurement. On the other hand, it is also necessary to wait until the transient current for the capacitor of bias-T 714 connected to the drain terminal has subsided in order to obtain an accurate measurement.

In this case, it goes without saying that the measurement will be inaccurate if DC measurement is performed without setting a sufficient delay time.

Next, the error in the measurement of the pulse waveform that will be applied to the gate terminal is large during pulse IV measurement, and there is therefore the possibility that there will be a large error in the measurement of the IV characteristic. By means of conventional measurement apparatus 700 for FET characteristics, pick-off T 708 for monitoring the pulse voltage is disposed in front of bias-T 710. This is apparently done in order to avoid a situation where the correct pulse voltage measurement cannot be obtained due to the current flowing from pick-off T 708 to oscilloscope 704 if pick-off T 708 is inserted behind bias-T 710. Nevertheless, because of its structure, it is difficult to obtain a bias-T having a sufficiently wide band pass and flat characteristics; therefore, the waveform of the pulse becomes distorted. Consequently, the pulse voltage waveform that is measured by oscilloscope 704 and the pulse voltage waveform actually applied to the gate terminal of DUT 712 are different, and this increases the possibility of an error in the measurement of the IV characteristic. As an example describing this phenomenon, FIG. 6 shows waveform P at the AC port (solid line) and waveform Q at the AC+DC port (broken line) when a pulse of 100 nsec, which is approximately the condition used in pulse IV measurement, has been applied to a commercial pulse bias-T having a usable frequency band of 12 kHz to 15 GHz. Judging from FIG. 6, the slope of waveform Q is long from the rise in the pulse until it gets settled, and there is a perception of undulation once it does get settled, but this type of distortion is not obvious when waveform P is measured.

When the pulse parameters (period, width, rise time, fall time) are changed, it becomes necessary to switch the both of the two bias-Ts with conventional measurement apparatus 700 for FET characteristics, and this increases operating time and material cost. In essence, the bias-T acts as a band-pass filter; therefore, it is necessary to carefully select the bias-T in accordance with the pulse parameters when measurement is performed using pulses. As a result, it is necessary to switch between two bias-Ts with changes in the pulse parameters that are used.

SUMMARY

The measurement apparatus for FET characteristics of the present disclosure is characterized in that it comprises a pulse generator; a divider connected to the pulse generator for dividing pulses from the pulse generator into first and second pulses; a first SMU for supplying voltage; a first switch connected to the divider and the first SMU for selecting pulses from the divider or voltage from the first SMU, and outputting signals; a terminal resistor having one terminal connected to the first switch and a device under test and the other terminal connected to ground for applying signals from the first switch and supplying said signals to the first terminal of the device under test; a second and a third SMU; a bias-T connected to the third SMU for outputting signals obtained by multiplexing the voltage from the third SMU and signals that do not have a direct current component; a second switch connected to the second terminal of the device under test, the second SMU and the bias-T for selecting to connect the second terminal to the second SMU or to connect the second terminal to the signals of the bias-T obtained by multiplexing the voltage from the third SMU; and voltage measurement unit connected to the divider and the bias-T for measuring the second pulse of the divider and the signals of the bias-T that do not have a direct current component, wherein, when the direct current characteristics of the device under test are measured, the first and second SMUs are connected to the device under test, and when the alternating current characteristics of the device under test are measured, the first and second switches are selected such that the pulse generator, the third SMU, and the voltage measurement unit are connected to the device under test.

The present disclosure also includes an embodiment wherein the measurement apparatus for FET characteristics further comprises a controller; an embodiment wherein the controller comprises a processor and a memory; an embodiment wherein the first and second switches are RF switches; an embodiment wherein the second SMU also measures current; and an embodiment wherein the voltage measurement unit is an oscilloscope.

As described above, when the present disclosure is used, it is possible to provide a measurement apparatus for FET characteristics with which high-precision, high-speed FET characteristic measurement is performed while switching between DC measurement and AC measurement without reconnecting cables.

Moreover, when the present disclosure is used, there are no effects from the delay that results when transient current flows to the capacitor of the bias-T during DC measurement and high-speed measurement is therefore possible.

Furthermore, when the present disclosure is used, it is possible to accurately measure the pulse applied to the gate terminal of the DUT during AC measurement.

Furthermore, when the present disclosure is used, it is possible to reduce the time it takes to switch the parts that must be switched and the cost of the switched parts when there is a change in the parameters of the pulse applied during AC measurement.

DETAILED DESCRIPTION OF THE PREFERRED EMBODIMENT

Figure 1:
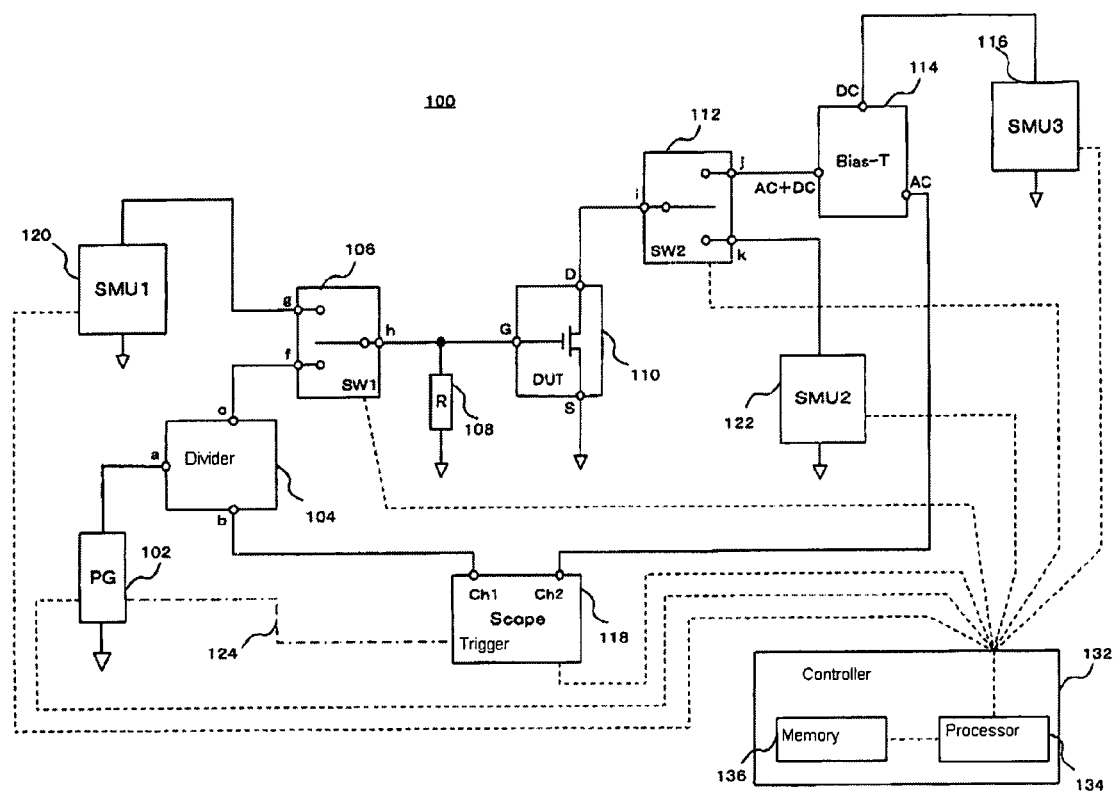
FIG. 1 is a block drawing of the measurement apparatus for FET characteristics of the present disclosure.

Measurement apparatus 100 for FET characteristics, which is a preferred embodiment of the present disclosure, will be described while referring to the block diagram of FIG. 1.

The output of a pulse generator (PG) 102 is connected to terminal a (or connector a, same hereafter) of a divider 104, and one of the output signals obtained by dividing one signal into two signals inside divider 104 is connected from terminal b to input terminal Ch1 of an oscilloscope (scope) 118. The other output signal obtained by division at the divider is connected from terminal c to terminal f of a switch (SW1) 106. Terminal h of switch 106 is connected to gate terminal G of a device under test (DUT) 110, and to a terminal resistor R (108). The other end of terminal resistor 108 is grounded. Pulse generator 102 and oscilloscope 118 are connected by a cable 124, as shown by the dashed line in FIG. 1, and transmit trigger signals. The oscilloscope here can be a digital oscilloscope, which can easily measure voltage.

Source terminal S of DUT 110 is grounded, and drain terminal D is connected to terminal i of a switch (SW2) 112. Terminal j of switch 112 is connected to the AC+DC port of a bias-T (Bias-T) 114. The DC port of bias-T 114 is connected to a source measuring unit (SMU) 116 (SMU 116 is differentiated as SMU3 hereafter). An SMU is a measuring unit having both a function for DC voltage application and a function for current measurement, and examples are the SMUs loaded in the Agilent 4156, Agilent E5270, and Agilent B1500 devices made by Agilent Technologies. Moreover, other measuring units having a DC voltage application function and a current measurement function can also be used. The AC port of bias-T 114 is connected to input terminal Ch2 of oscilloscope 118.

An SMU 120 (SMU1 hereafter) is connected to terminal g of switch 106. An SMU 122 (SMU2 hereafter) is connected to terminal k of switch 112.

Ch1 and Ch2 of oscilloscope 118 are connected to the internal impedance, in essence, the shunt resistance, inside the oscilloscope and can measure voltage. This shunt resistance is typically 50 ohms.

Switches SW1 (106) and SW2 (112) are RF relays with a wide bandwidth so as to pass pulses having a short pulse width. An example of an RF relay is the single-pole double-throw (SPDT) switch Agilent N1810TL Coaxial Switch made by Agilent Technologies, which has a useable frequency range of from DC to 26.5 GHz.

Moreover, measurement apparatus 100 for FET characteristics comprises a controller 132 for controlling the inside of the apparatus, and as shown by the broken lines in FIG. 1, the controller is connected to and controls pulse generator 102, oscilloscope 118, SMU1 (120), SMU2 (122), SMU3 (116), SW1 (106), and SW2 (112). A processor 134 and a memory 136 are housed inside controller 132 and are used for a variety of controls. Controller 132, for instance, can be a personal computer (PC) loaded with Windows® OS or UNIX® OS, a workstation loaded with UNIX® OS, or another type of sequence control device; processor 134 can be an arithmetic unit such as a CPU, MPU, DSP, or gate array; and memory 136 can be a memory such as a RAM, ROM, or hard disk drive, or a memory access means such as a CD drive or DVD drive. Moreover, it is possible to use a bus, such as a GPIB (General Purpose Interface Bus) for the control bus from controller 132 to each device. In addition to the OS for controlling this measurement apparatus 100 for FET characteristics, the various programs necessary for testing, the various settings for testing, the various test result measurements and the calculations based thereon, etc., are stored in memory 136.

Figure 2:
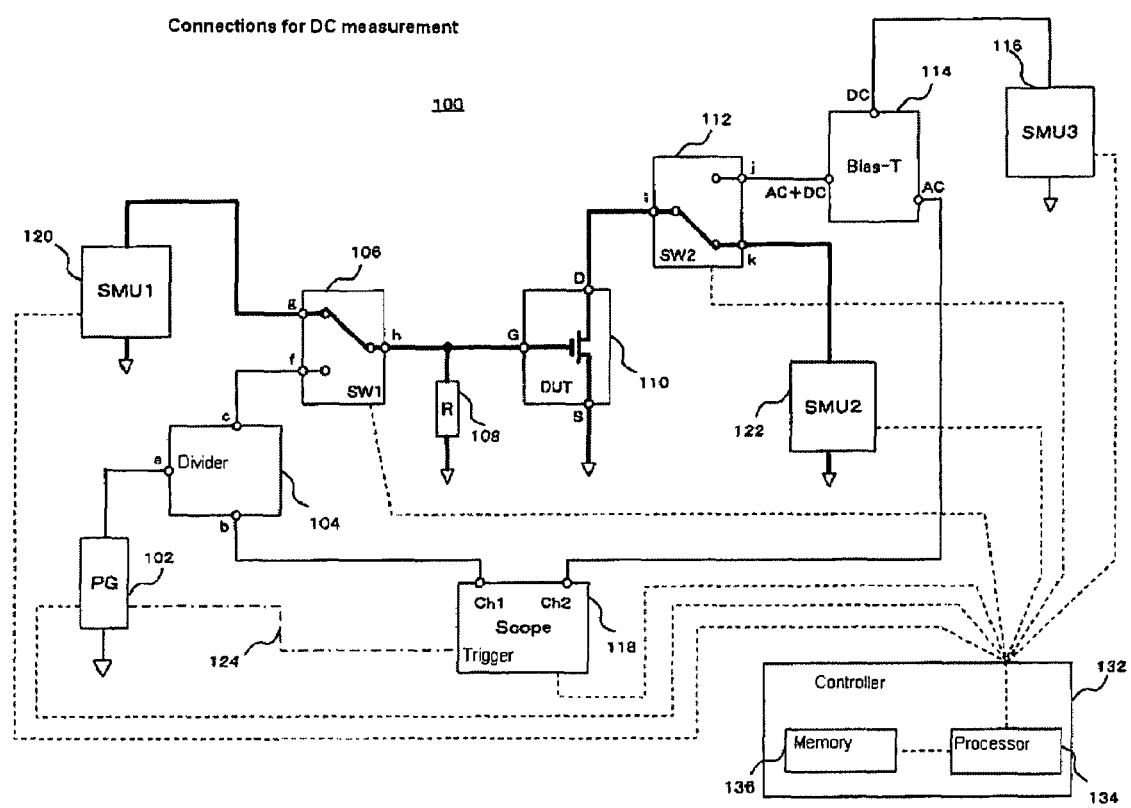
FIG. 2 is a schematic drawing describing the DC measurement circuit in the block drawing in FIG. 1.

Next, the connections and operation during DC measurement by measurement apparatus 100 for FET characteristics of the present disclosure will be described while referring to FIG. 2. During DC measurement, SW1 (106) is controlled by controller 132 such that terminal g and terminal h are connected, and SW2 (112) is controlled by controller 132 such that terminal i and terminal k are connected. As a result, it is possible to measure the DC characteristics, such as the desired IV characteristic, of DUT 110 using SMU 1 (120) and SMU 2 (122). For instance, the current that is flowing is measured while voltage is applied to gate terminal G of DUT 110 by SMU 1 (120) and bias is applied to drain terminal D by SMU 2 (122). In this case, there are no capacitors of the bias-T or inductive elements such as inductors in the circuit for DC measurement and the DC characteristics can therefore be measured with high precision.

Figure 3:
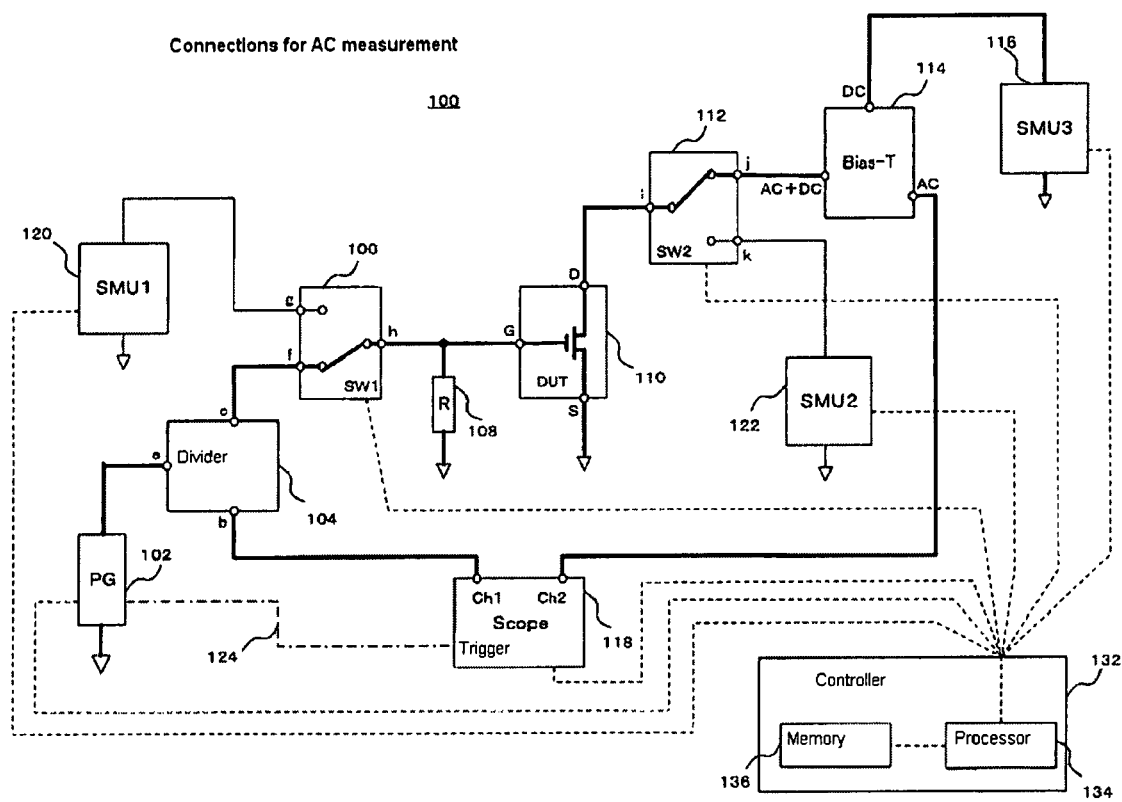
FIG. 3 is a schematic drawing describing the AC measurement circuit in the block drawing in FIG. 1.
Figure 4:
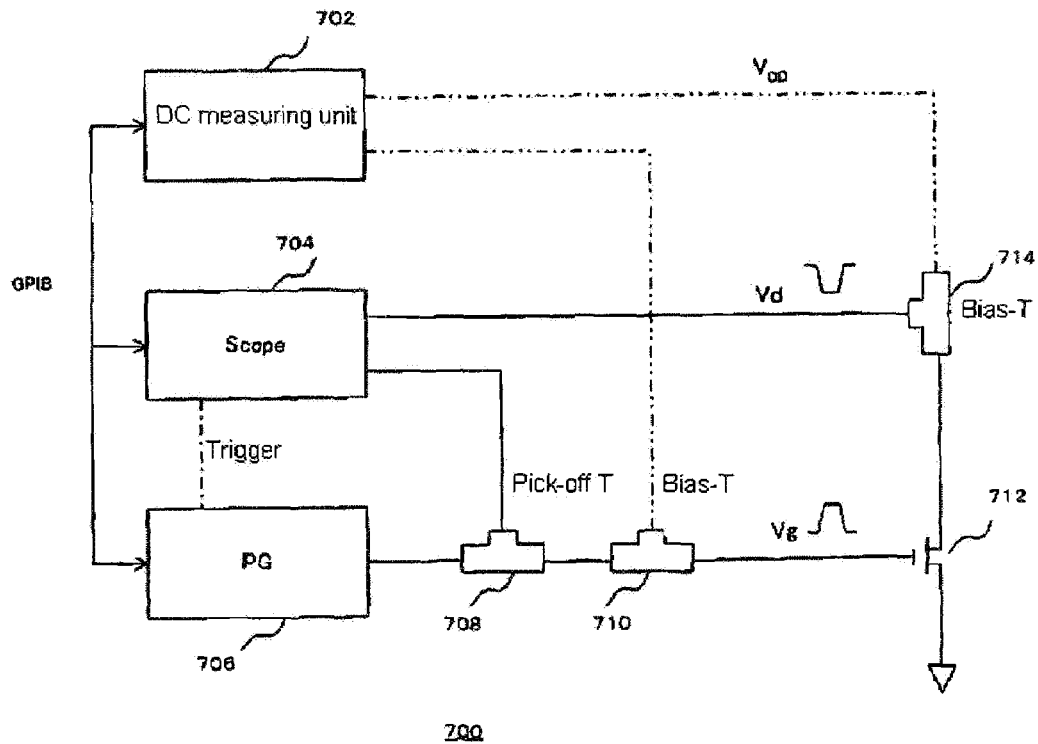
FIG. 4 is a block drawing showing a conventional measurement apparatus for FET characteristics.
Figure 5:
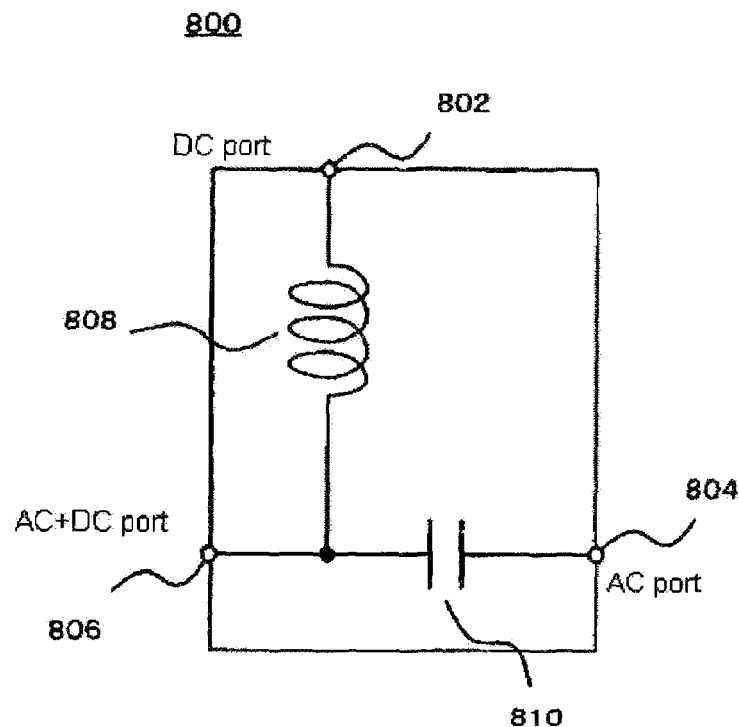
FIG. 5 is a circuit diagram that explains the structure of the bias-T.
Figure 6:
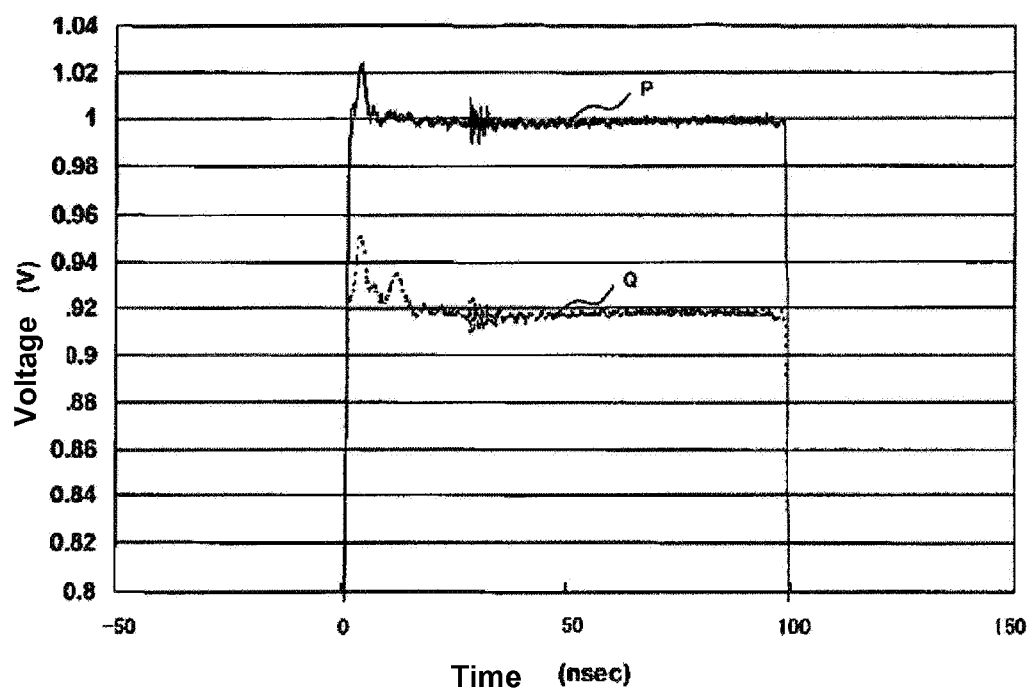
FIG. 6 is a waveform drawing that shows the effects of waveform when a pulse passes through the bias-T.

The connections and operation during AC measurement, such as pulse IV measurement, of measurement apparatus 100 for FET characteristics of the present disclosure will be described while referring to FIG. 3. During AC measurement, SW1 (106) is controlled by controller 132 such that terminal f and terminal h are connected and SW2 (112) is controlled by controller 132 such that terminal i and terminal j are connected. As a result, the pulses output from pulse generator 102 are divided in two, from terminal a to terminal b and to terminal c, by divider 104. The pulses output from terminal b of divider 104 are monitored by input Ch1 of oscilloscope 118. The pulses output from terminal c of divider 104 are applied to terminal resistor R 108 and gate terminal G of DUT 110 via switch SW1 (106).

Figure 7:
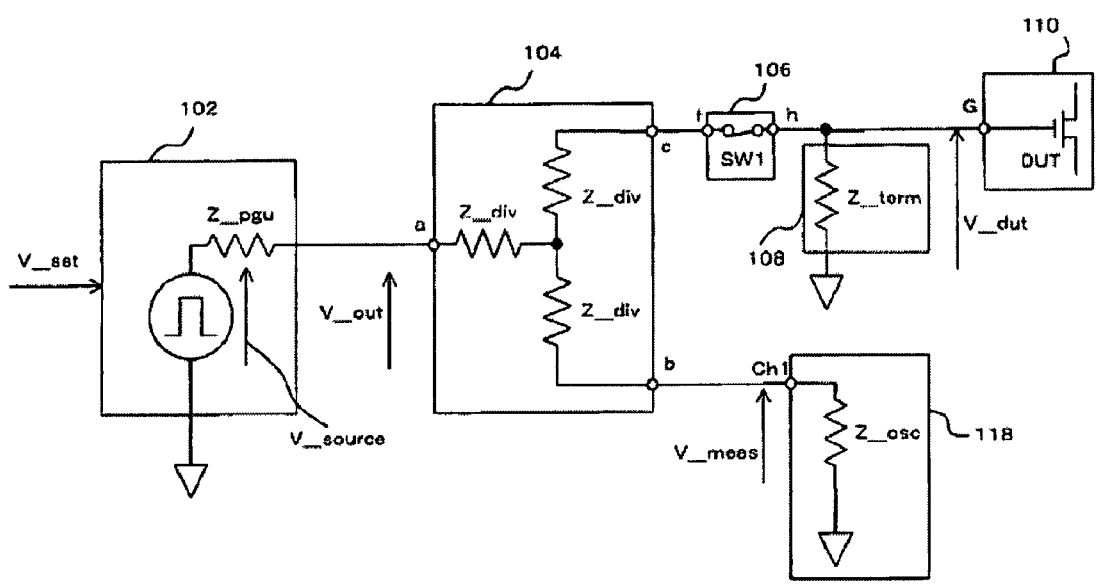
FIG. 7 is a circuit diagram that explains the operation in front of the gate terminal of the DUT in FIG. 3.

The circuit from pulse generator 102 to gate terminal G of DUT 110 will now be described while referring to FIG. 7. Pulse generator 102 comprises an output impedance Z_pgu, and a voltage pulse from V_source is generated for the pulse setting V_set. Z_pgu is typically 50 ohms. Divider 104 is connected to each terminal by connecting three Z_div resistors in a "star" shape. Each Z_div is typically 50/3 ohms. An internal impedance Z_osc is connected internally to input terminal Ch1 of oscilloscope 118, and Z_osc is typically 50 ohms. The resistance of terminal resistor 108 connected to terminal c of the divider is also 50 ohms. The input impedance of the gate terminal of the DUT is usually several megaohms or greater, and is apparently much greater than 50 ohms. Therefore, the synthetic impedance of the gate terminal to which the terminal resistor is connected as viewed from terminal h of switch (SW1) 106 can be regarded as approximately 50 ohms.

Consequently, with respect to pulse voltage V_out that has been output from pulse generator 102 to terminal a of divider 104, the impedance associated with terminals b and c inside divider 104 is the same for both; therefore, voltage V_dut applied to gate terminal G of DUT 110 is the same as voltage V_meas applied to input terminal Ch1 of oscilloscope 118. By means of such a design, the voltage applied to the gate terminal can be precisely measured by measuring the voltage that is the same as the voltage applied to the gate terminal of the DUT using oscilloscope 118.

It is possible to measure the baseline voltage and the wave height of the same pulse as applied to gate terminal G of DUT 110 with oscilloscope 118 when the baseline voltage of the pulse has been set at any voltage by pulse generator 102.

It should be noted that when modifications are made, such as when Z_pgu, Z_div, Z_term, and Z_osc are different values, or when the resistances inside the divider are not the same, it is possible to accomplish the object of the above-mentioned design by making adjustments appropriate to these modifications. In this case, it is necessary to know these resistance values and to be able to easily estimate these values when they change.

Returning to FIG. 3, a bias voltage from SMU 3 (116) is applied to drain terminal D of DUT 110 via the DC port and the AC+DC port of bias-T 114, and the voltage at drain terminal D of DUT 110 is measured at input Ch2 of oscilloscope 118 via the AC port of bias-T 114. As described in FIG. 7, the internal impedance Z_osc is connected to input Ch2 of oscilloscope 118, and here it is possible to obtain the measured voltage and the value of the drain current flowing from this internal impedance Z_osc to DUT 110.

The connections and settings used for the above-mentioned DC and AC measurements are controlled from controller 132 and the measurements are also accessed and stored by controller 132.

As is clear from the above-mentioned description, when measurement apparatus 100 for FET characteristics of the present disclosure is used, resources such as measuring units that are used for DC measurement and AC measurement can be switched and connected by two wide-bandwidth RF switches.

Consequently, a bias-T is not connected in the circuit during DC measurement; therefore, it is not necessary to wait until the transient current flowing to the capacitor has subsided in order to conduct the measurement; this is only necessary for AC measurement; therefore, DC measurement can be performed quickly.

Moreover, it is possible to accurately measure the voltage applied to the gate terminal of the DUT by connecting a terminal resistor of known resistance to the gate terminal of the DUT and further dividing the output of the pulse generator by a divider and connecting the output to the gate terminal of the DUT and the oscilloscope, because there will be no capacitors or inductive elements such as inductors that limit the bandwidth in the circuit from the pulse generator to the gate terminal. It is easy to find a terminal resistor having flat frequency characteristics over a wide band region, and this will help in obtaining very precise measurements.

Consequently, when measurement apparatus 100 for FET characteristics of the present disclosure is used, it is possible to perform very precise AC measurement, and to perform DC measurement that is more precise and with a shorter delay time than in the past without the trouble of changing connections. As a result, an operator can compare the values of AC measurements and DC measurements accurately and quickly.

Furthermore, even if the parameters of the pulse applied during AC measurement change, the only component that must be switched with this change is one bias-T; therefore, the operating time and the cost of preparing components for switching can be reduced.

Accordingly, the present disclosure can provide a measurement apparatus for FET characteristics with which it is possible to switch between DC measurement and AC measurement, such as pulse IV measurement, and perform high-precision, high-speed measurement of FET characteristics without reconnecting cables manually.

The present disclosure can also provide a measurement apparatus for FET characteristics that is not affected during DC measurement by the delay time that is produced when transient current flows to the capacitor of the bias-T; and yet another object of the present disclosure is to provide a measurement apparatus for FET characteristics with which the pulse applied to the gate terminal of the DUT during AC measurement can be accurately measured.

The present disclosure can provide a measurement apparatus for FET characteristics with which it is possible to reduce the time it takes to switch components that must be switched and the cost of the switched components when there is a change in the parameters of the pulse applied during AC measurement.

The above description has described embodiments of the present disclosure, but various modifications and alterations based on the intent of the present disclosure are also possible.

What is claimed is:

1. A measurement apparatus for FET characteristics, comprising:
    a pulse generator;
    a divider connected to the pulse generator for dividing pulses from the pulse generator into first and second pulses;
    a first SMU for supplying voltage;
    a first switch connected from the divider and the first SMU for selecting pulses from the divider or voltage from the first SMU, and outputting signals;
    a terminal resistor having one terminal connected to the first switch and a device under test and the other terminal connected to ground for applying signals from the first switch and supplying said signals to the first terminal of the device under test;
    a second and a third SMU;
    a bias-T connected to the third SMU for outputting signals obtained by multiplexing the voltage from the third SMU and signals that do not have a direct current component;
    a second switch connected to the second terminal of the device under test, the second SMU and the bias-T for selecting to connect said second terminal to the second SMU or to connect said second terminal to signals of the bias-T obtained by multiplexing the voltage from the third SMU; and
    voltage measurement unit connected to the divider and the bias-T for measuring the second pulse of the divider and the signals of the bias-T that do not have a direct current component, wherein
    when the direct current characteristics of the device under test are measured, the first and second SMUs are connected to the device under test, and when the alternating current characteristics of the device under test are measured, the first and second switches are selected such that the pulse generator, the third SMU, and the voltage measurement unit are connected to the device under test.

2. The measurement apparatus for FET characteristics according to claim 1, further comprising a controller.

3. The measurement apparatus for FET characteristics according to claim 2, wherein said controller comprises a processor and a memory.

4. The measurement apparatus for FET characteristics according to claim 1, wherein said first and second switches are RF switches.

5. The measurement apparatus for FET characteristics according to claim 1, wherein said second SMU also measures current.

6. The measurement apparatus for FET characteristics according to claim 1, wherein said voltage measurement unit is an oscilloscope.

* * * * *